United States Patent
Seo et al.

(10) Patent No.: US 11,825,673 B2
(45) Date of Patent: Nov. 21, 2023

(54) DISPLAY DEVICE

(71) Applicant: Samsung Display Co., Ltd., Yongin-si (KR)

(72) Inventors: Jin-Suk Seo, Cheonan-si (KR); Eung Taek Kim, Hwaseong-si (KR); Tae Sik Kim, Hanam-si (KR); Hee Yeon Kim, Daegu (KR); Jong Hyun Yun, Suwon-si (KR); Na Lae Lee, Suwon-si (KR); Jin-Suk Lee, Gwangmyeong-si (KR); Joo Hyeon Jo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 243 days.

(21) Appl. No.: 17/146,845

(22) Filed: Jan. 12, 2021

(65) Prior Publication Data
US 2022/0013743 A1 Jan. 13, 2022

(30) Foreign Application Priority Data
Jul. 9, 2020 (KR) .................. 10-2020-0084853

(51) Int. Cl.
*H10K 50/13* (2023.01)
*H10K 85/60* (2023.01)
(52) U.S. Cl.
CPC ........... *H10K 50/13* (2023.02); *H10K 85/621* (2023.02)

(58) Field of Classification Search
CPC ... H01L 51/504; H01L 51/0053; H10K 50/13; H10K 85/621; H10K 50/844; H10K 77/111; H10K 59/126; H10K 59/12; H10K 50/85; H10K 85/00; H10K 71/00; H10K 50/11
See application file for complete search history.

(56) References Cited

U.S. PATENT DOCUMENTS

| 7,531,847 B2 * | 5/2009 | Shitagaki | H10K 50/828 257/40 |
| 2006/0061269 A1 * | 3/2006 | Tsuchiya | H01L 29/78675 313/506 |
| 2006/0240232 A1 * | 10/2006 | Faris | G02B 1/111 428/447 |
| 2022/0010069 A1 * | 1/2022 | Park | C08J 5/18 |

FOREIGN PATENT DOCUMENTS

| JP | 6286821 B2 | 3/2018 |
| KR | 10-2013-0038944 A | 4/2013 |
| KR | 10-2019-0027984 A | 3/2019 |
| KR | 10-2054611 B1 | 12/2019 |
| KR | 10-2020-0017787 A | 2/2020 |

* cited by examiner

*Primary Examiner* — Victor A Mandala
(74) *Attorney, Agent, or Firm* — Lewis Roca Rothgerber Christie LLP

(57) ABSTRACT

A display device includes: a substrate; a transistor positioned on the substrate; and a light-emitting device electrically connected to the transistor, wherein the substrate includes a first layer, a second layer positioned between the first layer and the transistor, and a third layer positioned between the second layer and the transistor, the first layer and the third layer include organic materials, and the organic material included by the first layer and the organic material included by the third layer have different half-lives for a corona discharge.

18 Claims, 17 Drawing Sheets

DISPLAY DEVICE

CROSS-REFERENCE TO RELATED APPLICATION

This application claims priority to and the benefit of Korean Patent Application No. 10-2020-0084853, filed in the Korean Intellectual Property Office on Jul. 9, 2020, the entire content of which is incorporated herein by reference.

BACKGROUND

1. Field

The present disclosure relates to a display device.

2. Description of the Related Art

In general, a display device is produced by positioning a transistor on a rigid and/or flexible substrate and disposing a light-emitting device to be electrically connected to the transistor. The display device may be utilized as a display unit for a small product such as a smart phone, as well as utilized as a display unit for a large product such as a television.

When the rigid substrate and/or flexible substrate physically contacts an external object, electrification (e.g., static electric charge) may be generated, and elements such as transistors may be damaged by the static electricity. Further, in the case of the display device including a flexible substrate, the flexible substrate may include an organic film and an inorganic film, and as an electrical stress is applied at an interface of the organic film and the inorganic film, light stains or afterimages may be generated.

The above information disclosed in this Background section is only for enhancement of understanding of the background of the present disclosure, and therefore it may contain information that does not form the prior art that is already known to a person of ordinary skill in the art.

SUMMARY

One or more aspects of the present disclosure are directed toward a substrate with improved reliability and a display device including the same, and further directed toward methods of improving display quality to reduce light stains or afterimage characteristics.

According to an example embodiment of the present disclosure, a display device includes: a substrate; a transistor on the substrate; and a light-emitting device electrically connected to the transistor, wherein the substrate includes a first layer, a second layer between the first layer and the transistor, and a third layer between the second layer and the transistor, the first layer includes a first organic material and has a first half-life and the third layer includes a second organic material and has a second half-life, and the first organic material included in the first layer and the second organic material included in the third layer have different half-lives for a corona discharge. The first layer and the third layer may each be manufactured (formed) by utilizing an aromatic carboxylic acid and a polyamic acid generated by polymerizing a dianhydride monomer and a diamine monomer.

The aromatic carboxylic acid for forming the first layer (e.g., a first content) may be different in content from the aromatic carboxylic acid for forming the third layer (e.g., a second content).

The second content may be greater than the first content.

The first half-life of the first layer may be less than the second half-life of the third layer.

The second half-life of the third layer may be equal to or greater than 60 seconds.

The first layer and the third layer may have substantially a same scattering vector (q) value in small-angle X-ray scattering (SAXS) caused in irradiation of X-rays.

The first layer may have a first transmittance and the third layer may have a second transmittance different from the first transmittance at a set or specific wavelength.

The second transmittance of the third layer at the set or specific wavelength may be higher than the first transmittance of the first layer.

The second transmittance of the third layer may be equal to or greater than 80% at a wavelength of 450 nm.

According to another embodiment of the present disclosure, a display device includes: a substrate; a transistor on the substrate; and a light-emitting device electrically connected to the transistor, wherein the substrate may include a first layer, a second layer between the first layer and the transistor, and a third layer between the second layer and the transistor, the first layer and the third layer include organic materials, and the first layer and the third layer have different scattering vector (q) values in small-angle X-ray scattering (SAXS).

One selected from among the first layer and the third layer may have a scattering vector value in a range of about 7.87 to about 8.15, and the other one thereof may have a scattering vector value outside of the range.

The first layer may have a first half-life and the third layer may have a second half-life different from the first half-life for a corona discharge.

The first half-life of the first layer may be less than the second half-life of the third layer.

The second half-life of the third layer may be equal to or greater than 60 seconds.

According to yet another embodiment of the present disclosure, a display device includes: a substrate; a transistor on the substrate; and a light-emitting device electrically connected to the transistor, wherein the substrate includes a first layer, a second layer between the first layer and the transistor, and a third layer between the second layer and the transistor, the first layer and the third layer include organic materials, and the first layer has a first transmittance and the third layer has a second transmittance different from the first transmittance at a specific wavelength.

The second transmittance of the third layer may be higher than the first transmittance of the first layer.

The second transmittance of the third layer may be equal to or greater than 80% at a wavelength of 450 nm.

The first layer and the third layer may have different scattering vector (q) values in small-angle X-ray scattering (SAXS).

One of selected from among the first layer and the third layer may have a scattering vector value in a range of about 7.87 to about 8.15, and the other one thereof may have a scattering vector value outside of the range.

According to the example embodiments, the display device with the improved light stain or afterimage characteristic is provided. However, the scope of the present disclosure is not limited by the above-noted effect.

DETAILED DESCRIPTION OF THE DRAWINGS

Figure 1:
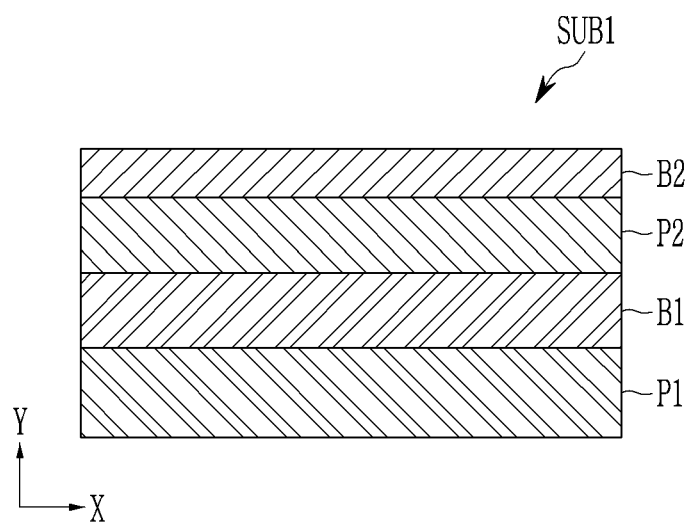
FIG. 1 shows a cross-sectional view of a substrate according to an embodiment.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

Parts that are irrelevant to the description will be omitted to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. In the drawings, the thickness of layers, films, panels, regions, etc., may be exaggerated for clarity. The thicknesses of some layers and areas may be exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" refers to be positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" refers to viewing an object portion from the top, and the phrase "in a cross-sectional view" refers to viewing a cross-section of which the object portion is vertically cut from the side.

Figure 2:
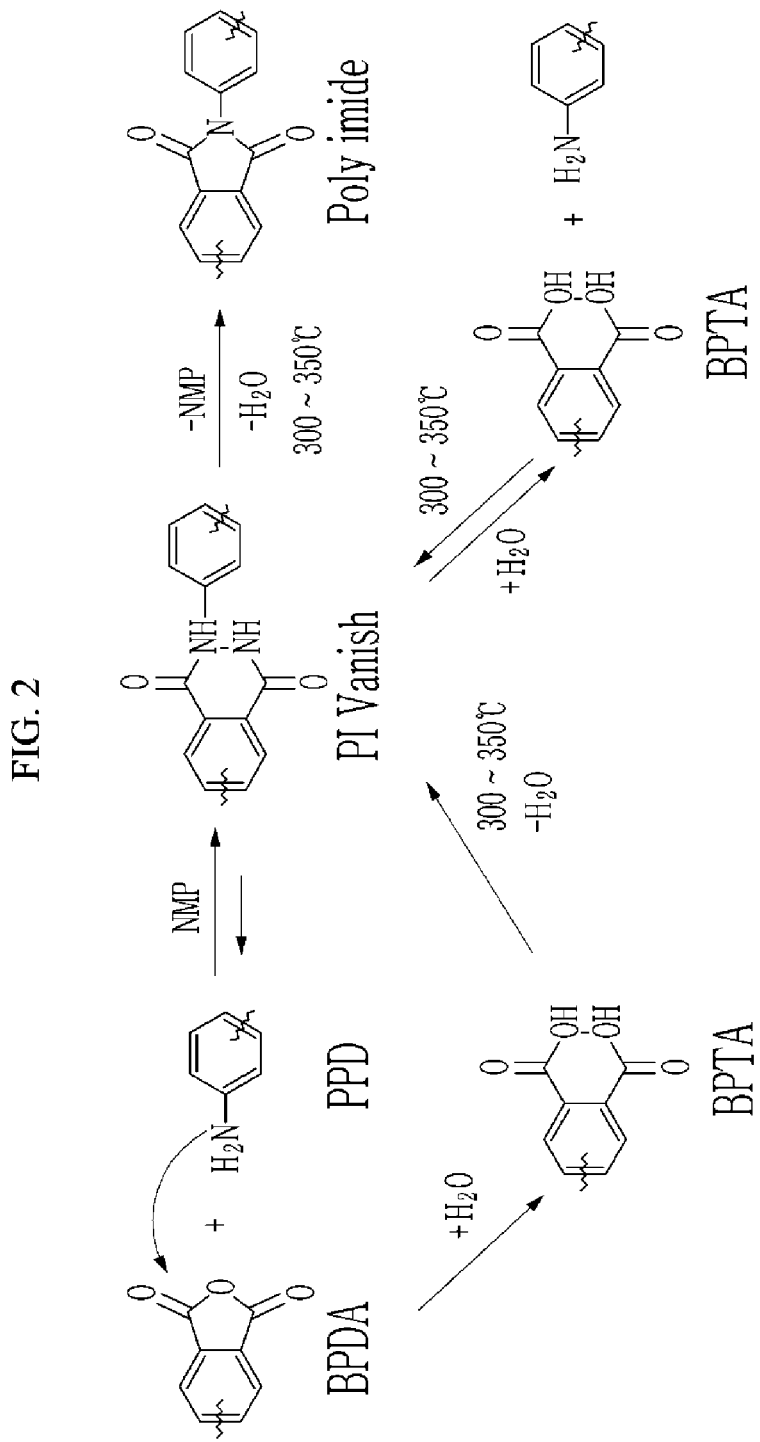
FIG. 2 schematically illustrates a synthetic scheme of a material for forming a first layer and a third layer of a substrate according to an embodiment.

A substrate according to an example embodiment will now be described with reference to FIG. 1 and FIG. 2. FIG. 1 shows a cross-sectional view of a substrate according to an example embodiment, and FIG. 2 schematically illustrates a synthetic scheme of a material for forming a first layer and a third layer of a substrate according to an example embodiment.

Referring to FIG. 1, the substrate SUB1 according to an example embodiment may be flexible. The substrate SUB1 may include a first layer P1, a second layer B1, a third layer P2, and a fourth layer B2. The fourth layer B2 may be omitted in some example embodiments.

The first layer P1 and the third layer P2 may be made of organic materials with desired (e.g., excellent) heat resistance and durability such as a polyimide, a polyethylene naphthalate, a polyethylene terephthalate (PET), a polyacrylate, a polycarbonate, a polyetherimide (PEI), and/or a polyethersulfone.

The first layer P1 and the third layer P2 may transmit moisture and/or oxygen more easily compared to the glass substrate, so they may degrade (e.g., cause a degradation of) a light-emitting device that is weak (e.g., sensitive) to moisture and/or oxygen. A corresponding lifespan of the light-emitting device may be deteriorated. To improve the moisture and/or oxygen resistance, the second layer B1 may be positioned on the first layer P1, and the fourth layer B2 may be positioned on the third layer P2.

The second layer B1 and the fourth layer B2 may be made of inorganic materials (such as a metal oxide, a silicon nitride, a silicon oxide, a silicate, etc.) and/or an organic silicon-based compound. For example, the second layer B1 and the fourth layer B2 may be made to be a single or multiple inorganic layers utilizing materials such as $AlO_3$, $SiO_2$, and/or $SiN_x$. Further, according to an example embodiment, conductivity may be increased by doping fluorine or boron on the second layer B1 and/or the fourth layer B2.

Water vapor transmission rates (WVTR) of the second layer B1 and the fourth layer B2, each made of a single layer or a multilayer, may be equal to or less than $10^{-5}$ g/m² day, respectively.

The present specification illustrates an example embodiment in which the substrate SUB1 includes a fourth layer B2. However, embodiments of the present disclosure are not limited thereto and in some embodiments, the fourth layer B2 may be omitted or may be replaced with the buffer layer positioned on the substrate SUB1.

The first layer P1 and the third layer P2 may each include a polyimide. In this instance, the first layer P1 and the third layer P2 may include polyimides having different physical properties. The polyimides with different physical properties may be produced by controlling a content of an aromatic carboxylic acid during a process for synthesizing the polyimide.

The first layer P1 and the third layer P2 including polyimides may be manufactured (formed) utilizing an aromatic carboxylic acid and a polyamic acid acquired (obtained) by polymerizing a dianhydride monomer and a diamine monomer. That is, the first layer P1 and the third layer P2 may be formed of polyimides manufactured by polymerizing an aromatic carboxylic acid and a polyamic acid, and the polyamic acid may be produced by polymerizing a dianhydride monomer and a diamine monomer.

The dianhydride monomer may be an aromatic tetracarboxylic dianhydride. Non-limiting examples of the aromatic tetracarboxylic dianhydride may exemplarily be pyromellitic dianhydride (or PMDA), 3,3',4,4'-biphenyl tetracarboxylic dianhydride (or BPDA), 2,3,3',4'-biphenyl tetracarboxylic dianhydride (or a-BPDA), oxydiphthalic dianhydride (or ODPA), diphenyl sulfone-3,4,3',4'-tetracarboxylic dianhydride (or DSDA), bis(3,4-dicarboxyphenyl)sulfide dianhydride, 2,2-bis(3,4-dicarboxyphenyl)-1,1,1,3,3,3-hexafluoro propane dianhydride, bis(3,4-dicarboxyphenyl) methane dianhydride, 2,2-bis(3,4-dicarboxyphenyl)propane dianhydride, p-phenylene bis(trimellitic monoester acid anhydride), p-biphenylene bis(trimellitic monoester acid anhydride), m-terphenyl-3,4,3',4'-tetracarboxylic dianhydride, p-terphenyl-3,4,3',4'-tetracarboxylic dianhydride, 1,3-bis(3,4-dicarboxyphenoxy)benzene dianhydride, 1,4-bis(3,4-dicarboxyphenoxy)benzene dianhydride, 1,4-bis(3,4-dicarboxyphenoxy)biphenyl dianhydride, 2,2-bis[(3,4-dicarboxyphenoxy) phenyl] propane dianhydride (BPADA), 2,3,6,7-naphthalene tetra carboxylic acid dianhydride, 1,4,5,8-naphthalene tetracarboxylic dianhydride, and 4,4'-(2,2-hexafluoro isopropylidene)diphthalic acid dianhydride. A single one or two or more thereof may be combined and utilized in some example embodiments.

The diamine monomer is an aromatic diamine, and may be exemplarily classified as follows.

1) A diamine with one benzene nucleus in its structure, which is a relatively rigid structure such as 1,4-diamino benzene (or paraphenylene diamine, PPA), 1,3-diamino benzene, 2,4-diamino toluene, 2,6-diamino toluene, and/or 3,5-diamino benzoic acid (or DABA);

2) A diamine with two benzene nuclei in its structure such as diamino diphenyl ethers (such as 4,4'-diamino diphenyl ether (or oxydianiline, ODA), 3,3'-diamino diphenyl ether, and/or 3,4'-diamino diphenyl ether), 4,4'-diamino diphenyl methane(methylene diamine), 3,3'-dimethyl-4,4'-diamino biphenyl, 2,2'-dimethyl-4,4'-diamino biphenyl, 2,2'-bis(trifluoromethyl)-4,4'-diamino biphenyl, 3,3'-dimethyl-4,4'-diamino diphenyl methane, 3,3'-dicarboxy-4,4'-diamino diphenyl methane, 3,3',5,5'-tetramethyl-4,4'-diamino diphenyl methane, bis(4-aminophenyl)sulfide, 4,4'-diamino benzanilide, 3,3'-dichlorobenzidine, 3,3'-dimethyl benzidine (or o-tolidine), 2,2'-dimethyl benzidine (or m-tolidine), 3,3'-dimethoxy benzidine, 2,2'-dimethoxy benzidine, 3,3'-diamino diphenyl sulfide, 3,4'-diamino diphenyl sulfide, 4,4'-diamino diphenyl sulfide, 3,3'-diamino diphenyl sulfone, 3,4'-diamino diphenyl sulfone, 4,4'-diamino diphenyl sulfone, 3,3'-diamino benzophenone, 4,4'-diamino benzophenone, 3,3'-diamino-4,4'-dichlorobenzophenone, 3,3'-diamino-4,4'-dimethoxybenzophenone, 3,3'-diamino diphenyl methane, 3,4'-diamino diphenyl methane, 4,4'-diamino diphenyl methane, 2,2-bis(3-aminophenyl)propane, 2,2-bis(4-aminophenyl)propane, 2,2-bis(3-aminophenyl)-1,1,1,3,3,3-hexafluoro propane, 2,2-bis(4-aminophenyl)-1,1,1,3,3,3-hexafluoro propane, 3,3'-diamino diphenyl sulfoxide, 3,4'-diamino diphenyl sulfoxide, and/or 4,4'-diamino diphenyl sulfoxide;

3) A diamine with three benzene nuclei in its structure such as 1,3-bis(3-aminophenyl)benzene, 1,3-bis(4-aminophenyl)benzene, 1,4-bis(3-aminophenyl)benzene, 1,4-bis(4-aminophenyl)benzene, 1,3-bis(4-aminophenoxy)benzene, 1,4-bis(3-aminophenoxy)benzene (or TPE-Q), 1,4-bis(4-aminophenoxy)benzene (or TPE-Q), 1,3-bis(3-aminophenoxy)-4-trifluoromethylbenzene, 3,3'-diamino-4-(4-phenyl) phenoxy benzophenone, 3,3'-diamino-4,4'-di(4-phenylphenoxy)benzophenone, 1,3-bis(3-aminophenylsulfide)benzene, 1,3-bis(4-aminophenyl sulfide)benzene, 1,4-bis(4-aminophenyl sulfide)benzene, 1,3-bis(3-aminophenyl sulfone)benzene, 1,3-bis(4-aminophenyl sulfone)benzene, 1,4-bis(4-aminophenyl sulfone) benzene, 1,3-bis [2-(4-aminophenyl)isopropyl] benzene, 1,4-bis [2-(3-aminophenyl)isopropyl] benzene, and/or 1,4-bis [2-(4-aminophenyl)isopropyl] benzene; and 4) A diamine with four benzene nuclei in its structure such as 3,3'-bis(3-aminophenoxy)biphenyl, 3,3'-bis(4-aminophenoxy)biphenyl, 4,4'-bis(3-aminophenoxy)biphenyl, 4,4'-bis(4-aminophenoxy)biphenyl, bis [3-(3-aminophenoxy)phenyl] ether, bis [3-(4-aminophenoxy)phenyl] ether, bis [4-(3-aminophenoxy)phenyl] ether, bis [4-(4-aminophenoxy) phenyl] ether, bis [3-(3-aminophenoxy)phenyl] ketone, bis [3-(4-aminophenoxy)phenyl] ketone, bis [4-(3-aminophenoxy)phenyl] ketone, bis [4-(4-amino phenoxy)phenyl] ketone, bis [3-(3-aminophenoxy)phenyl] sulfide, bis [3-(4-aminophenoxy)phenyl] sulfide, bis [4-(3-aminophenoxy) phenyl] sulfide, bis [4-(4-aminophenoxy)phenyl]sulfide, bis [3-(3-aminophenoxy)phenyl] sulfone, bis [3-(4-aminophenoxy)phenyl] sulfone, bis [4-(3-aminophenoxy)phenyl] sulfone, bis [4-(4-aminophenoxy)phenyl] sulfone, bis [3-(3-aminophenoxy)phenyl] methane, bis [3-(4-aminophenoxy) phenyl] methane, bis [4-(3-aminophenoxy)phenyl] methane, bis [4-(4-aminophenoxy)phenyl] methane, 2,2-bis [3-(3-aminophenoxy)phenyl] propane, 2,2-bis [3-(4-aminophenoxy)phenyl] propane, 2,2-bis [4-(3-aminophenoxy)phenyl] propane, 2,2-bis [4-(4-aminophenoxy)phenyl] propane (BAPP), 2,2-bis [3-(3-aminophenoxy)phenyl]-1,1,1,3,3,3-hexafluoro propane, 2,2-bis [3-(4-aminophenoxy)phenyl]-1,1,1,3,3,3-hexafluoro propane, 2,2-bis [4-(3-aminophenoxy)phenyl]-1,1,1,3,3,3-hexafluoro propane, and/or 2,2-bis [4-(4-aminophenoxy)phenyl]-1,1,1,3,3,3-hexafluoro propane.

A single kind or at least two kinds thereof may be combined and utilized according to the above-provided description. In some embodiments, the diamine monomer may be at least one selected from among 1,4-diamino benzene (PPD), 1,3-diamino benzene (MPD), 2,4-diamino toluene, 2,6-diamino toluene, and 3,5-diamino benzoic acid (DABA).

The aromatic carboxylic acid may be at least one selected from among 3,3',4,4'-biphenyl tetracarboxylic acid (BPTA), pyromellitic acid (PMA), 1,2,3,4-benzenetetracarboxylic acid, benzophenone-3,3',4,4'-tetracarboxylic acid, pyrazine tetra carboxylic acid, 2,3,6,7-naphthalenetetracarboxylic acid, and naphthalene-1,4,5,8-tetracarboxylic acid.

Referring to FIG. 2, the polyimide according to an example embodiment may be manufactured by utilizing BPDA as a dianhydride monomer, PPD as a diamine monomer, and BPTA as an aromatic carboxylic acid, and the present disclosure is not limited thereto. Although not specifically shown in the drawings, the BPTA may comprise a functional group such as —COOH (carboxylic acid) or —COOR (R is alkyl group or aryl group).

The first layer P1 and the third layer P2 according to an example embodiment may form polyimide layers with different physical properties by controlling a content of the aromatic carboxylic acid utilized in the manufacturing process. A first content of the aromatic carboxylic acid utilized in the process for manufacturing the first layer P1 may be different from a second content of the aromatic carboxylic acid utilized in the process for manufacturing the third layer P2. According to an example embodiment, the second content may be greater than the first content.

According to an example embodiment, the first layer P1 may be formed by utilizing 0.99 mol % of the dianhydride monomer and equal to or less than 0.01 mol % of the aromatic carboxylic acid. That is, the first layer P1 may be formed by utilizing a polyimide that is synthesized with 0.99 mol % of the dianhydride monomer and equal to or less than 0.01 mol % of the aromatic carboxylic acid. The first layer P1 including the polyimide manufactured by utilizing 0.01 mol % (or less) of the aromatic carboxylic acid may have a relatively better (e.g., excellent) thermal stability and mechanical characteristics.

According to an example embodiment, the third layer P2 may be formed by utilizing 0.98 mol % of the dianhydride monomer and about 0.040 to about 0.049 mol % of the aromatic carboxylic acid. That is, the third layer P2 may be formed by utilizing a polyimide synthesized with 0.98 mol % of the dianhydride monomer and about 0.040 to about 0.049 mol % of the aromatic carboxylic acid. In one embodiment, about 0.040 mol % of the aromatic carboxylic acid may be utilized. The third layer P2 including the polyimide manufactured by utilizing the aromatic carboxylic acid within these content ranges may have a relatively higher resistance characteristic. When charges are input or an electrical stress is applied to the substrate including the third layer P2 with a high resistance characteristic, the charges may be prevented or substantially prevented from moving to the display element or the transistor and influencing a threshold voltage or reliability of the device by the third layer P2 with a high resistance characteristic. When the third layer P2 is manufactured (e.g., utilizing a polyimide synthesized) with less than 0.040 mol % of the aromatic carboxylic acid, it may have a relatively lower resistance. Accordingly, the charges may move into the light-emitting device to deteriorate reliability of the device. Further, when the third layer P2 is manufactured (e.g., utilizing a polyimide synthesized) with greater than 0.049 mol % of the aromatic carboxylic acid, thermal stability and mechanical characteristics required of the substrate may be deteriorated.

The first layer P1 and the third layer P2 may have different half-lives, regarding the corona discharging method. That is, the first layer P1 and the third layer P2 may have different half-lives when measured utilizing the corona discharging method. For example, when the half-lives of the first layer P1 and the third layer P2 are measured by utilizing the corona discharging method, the half-life of the third layer P2 may be greater than the half-life of the first layer P1.

In the present specification, the corona discharging method signifies (e.g., represents) discharging in a non-conductive medium. In the discharging, the non-conductive medium (e.g., the first layer and/or the third layer) may be charged by an ion attachment (e.g., an electrode). A current leaving a high voltage particle sensor is measured by a transfer of charged particles. In the present specification, regarding the first layer P1 and the third layer P2, a time for measuring (e.g., reaching) the current that corresponds to one half the value of the current measured initially (e.g., for the first time) is referred to as a half-life.

The first layer P1 and the third layer P2 have different half-lives, and a gap (e.g., a difference) therebetween may be at least 30 seconds (s). The third layer P2 may have a half-life that is equal to or greater than 60 seconds, and the first layer P1 may have a half-life that is less than 60 seconds.

It is discovered that when the half-life (of a layer) obtained by the corona discharging method increases, resistance (of that layer) becomes larger. That is, it is found that, a layer with a large half-life indicates that the layer (with the large half-life or greater half-life value) is formed with a high resistance material (e.g., a material with a higher resistance). The third layer P2 formed by utilizing a relatively higher content of BPTA may have a greater half-life value than the first layer P1 formed by utilizing a relatively lower content of BPTA, and the third layer P2 may express (e.g., show) relatively higher resistance. Accordingly, the third layer P2, positioned near the transistor and the light-emitting device, includes a relatively high resistance material, so the charges may not move to the transistor or the light-emitting device to reduce deterioration of reliability and display quality (light stains or afterimages) of the device.

According to an example embodiment, the first layer P1 and the third layer P2 manufactured by (e.g., polyimides having) the content difference of the aromatic carboxylic acid may substantially have a same scattering vector value.

In more detail, the first layer P1 and the third layer P2 may have a value of q that is substantially the same scattering vector with reference to the side of (004) in a plane mode in small-angle X-ray scattering (SAXS) caused by an X-ray irradiation. That is, the first layer P1 and the third layer P2 may have substantially the same value of the scattering vector q on the side of (004) in a plane mode in small-angle X-ray scattering (SAXS) in response to an X-ray irradiation. This is because the contents of the added aromatic carboxylic acids are different but the back-bones are substantially the same. For example, when the thickness of a layer including a polyimide is about 10 micrometers, the value of q may be 7.91 to 8.15, and when the thickness of the layer including a polyimide is about 5.8 micrometers, the value of q may be 7.87 to 8.01.

According to an example embodiment, the dianhydride monomer and the diamine monomer are the same (e.g., for the first layer P1 and the third layer P2), and the first layer P1 and the third layer P2 manufactured with different content of the aromatic carboxylic acid may have substantially the same scattering vector value, and the scattering vector value may be about 7.87 to about 8.15 depending on the thickness of the first layer P1 and the third layer P2.

The scattering vector (q) defined in the SAXS is defined in Equation 1.

$$q=4\pi \sin \theta/\lambda \qquad \text{[Equation 1]}$$

Here, q is a scattering vector, $\theta$ is a ½ value of a scattering angle, and $\lambda$ is a wavelength of irradiated X-rays.

The small angle caused by the irradiation of X-rays signifies (e.g., indicates) a transmission mode or grazing incidence X-ray small-angle scattering, and for example, X-rays with the wavelength of 0.63 Å to 1.54 Å may be irradiated to an antireflection film in a 1 cm*1 cm (horizontal*vertical) size at the distance of 4 m and may be measured.

For example, the small angle X-ray scattering (SAXS) may be performed by transmitting the X-rays to the sample in the beamline of 4 C of a Pohang accelerator and measuring scattering strength according to the scattering vector (q). In further detail, the small-angle scattering may be measured by putting a sample to the position that is distanced from a detector by about 4 m and applying X-rays, the X-rays with the vertical size of 0.023 mm and the horizontal size of 0.3 mm may be utilized, and a 2D mar CCD (charged-coupled device) may be utilized as a detector. Further, a 2D diffraction pattern that is scattered is obtained as an image, the image is calibrated by utilizing the sample-to-detector distance acquired through the standard sample, and the scattering strength according to the scattering vector (q) may be converted through a circular average.

In another embodiment, differing from the above description, the first layer P1 and the third layer P2 may have different scattering vector values. In more detail, one selected from among the first layer P1 and the third layer P2 may have the value q of 7.87 to 8.15, and the other one may have a value q other than the range. For example, one selected from among the first layer P1 and the third layer P2 may have the value q in a range of 7.87 to 8.15, and the other one selected from among the first layer P1 and the third layer P2 may have a value q outside the range of 7.87 to 8.15. That is, the first layer P1 and the third layer P2 may include materials having different crystalline properties while including different materials. In this instance, the third layer P2 may have a relatively higher resistance and may provide desired (e.g., excellent) electrical characteristic, and the first layer P1 may provide a relatively higher thermal stability and mechanical characteristics.

In another embodiment, the first layer P1 and the third layer P2 according to an example embodiment may have different transmittance. The transmittance of the third layer P2 may be higher than the transmittance of the first layer P1. The third layer P2 may be made of a material that is more transparent than the first layer P1.

In more detail, transmittance of the first layer P1 and transmittance of the third layer P2 may be different by more than 10% with reference to a 450 nm wavelength (e.g., at a wavelength of 450 nm). According to an example embodiment, the third layer P2 may have a transmittance of equal to or greater than 80% with reference to a 450 nm wavelength (e.g., at a wavelength of 450 nm), and the first layer P1 may have a transmittance of equal to or less than 65% with reference to a 450 nm wavelength (e.g., at a wavelength of 450 nm). The first layer P1 may display a color.

When the substrate with a high transmittance such as the third layer P2 is utilized, it may be desirably utilized (e.g., advantageous to be utilized) in a display device in which a camera is positioned in the display area.

According to an example embodiment, the above-noted half-life value may be higher as the transmittance of the third layer P2 becomes higher. The third layer P2 may have a relatively higher resistance, and charges may be accumulated on the third layer P2 to give a slight electrical influence to the transistor or the light-emitting device stacked on the substrate. According to an example embodiment, the first layer P1 has a transmittance that is relatively lower than that of the third layer P2. However, the first layer P1 may have higher thermal stability and mechanical strength than the third layer P2.

Figure 3:
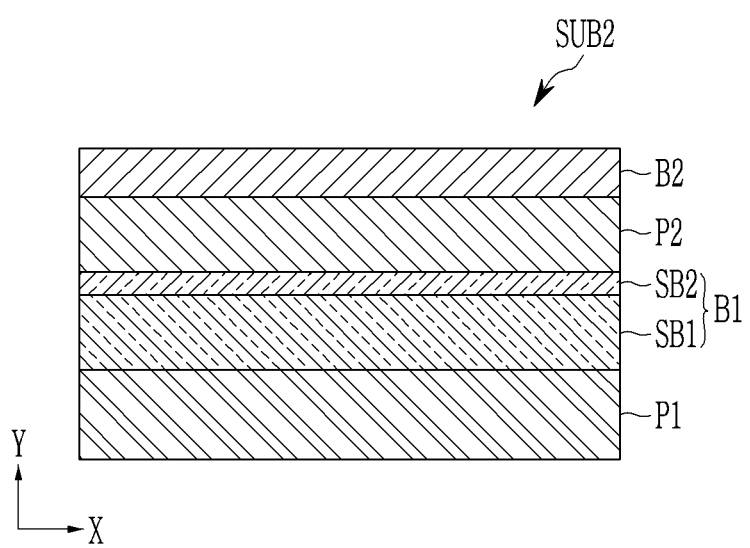
FIG. 3 shows a cross-sectional view of a substrate according to an embodiment.

A substrate according to an example embodiment will now be described with reference to FIG. 3. FIG. 3 shows a cross-sectional view of a substrate according to an example embodiment. Description of the same constituent elements as the above-described constituent elements will be omitted.

The substrate SUB2 may include a first layer P1, a second layer B1, a third layer P2, and a fourth layer B2. The first layer P1 and the third layer P2 have been described above. That is, the first layer P1 and the third layer P2 are respectively the same as described above.

The second layer B1 may include a first sub-layer SB1 and a second sub-layer SB2. For example, the first sub-layer SB1 may be made of a silicon oxide, and the second sub-layer SB2 may be made of an amorphous silicon (a-Si).

The first sub-layer SB1 may be formed to be thicker than the second sub-layer SB2. For example, the first sub-layer SB1 may be about 5000 angstroms to about 7000 angstroms thick, and the second sub-layer SB2 may be about 10 to 30 angstroms thick.

A display device according to an example embodiment will now be described with reference to FIGS. 4-9. FIGS. 4-9 each show cross-sectional views of a display device including a substrate according to a respective example embodiment, and descriptions of the same constituent elements as the above-described constituent element will be omitted.

Figure 4:
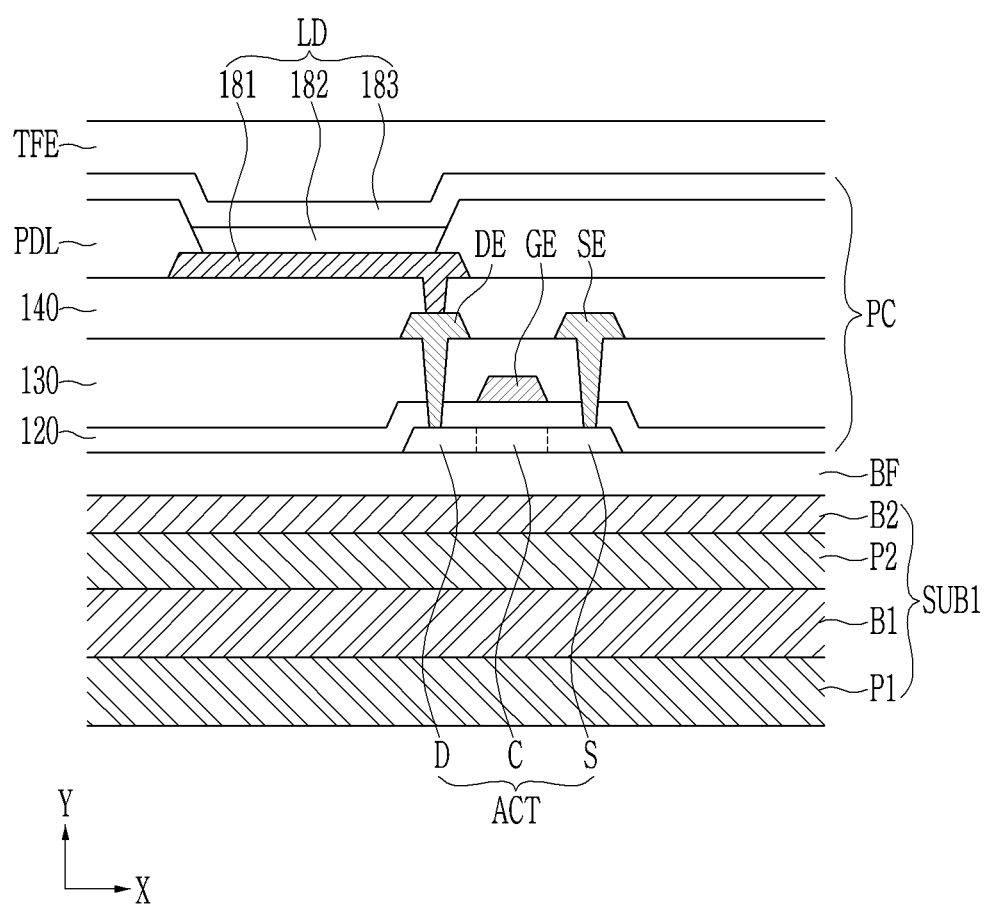
FIG. 4 shows a cross-sectional view of a display panel including a substrate according to an example embodiment.

Referring to FIG. 4, the display device includes a buffer layer (BF) positioned on the substrate SUB1, and a circuit portion (PC) positioned on the buffer layer (BF).

The buffer layer (BF) may overlap a front side of the substrate SUB1. The buffer layer (BF) may prevent or reduce metallic atoms or impurities from spreading to the circuit portion (PC), particularly the active layer (ACT), from the substrate SUB1. For the crystallization process for forming the active layer (ACT), a substantially uniform active layer (ACT) may be provided (e.g., obtained) by controlling a heat transfer rate. In FIGS. 4-9, the buffer layer (BF) is shown as a separate constituent element from the substrate SUB1, but embodiments of the present disclosure are not limited thereto and the buffer layer (BF) may be a constituent element included in the substrate SUB1.

The active layer (ACT) is positioned on the buffer layer (BF). The active layer (ACT) may include amorphous silicon or may include polycrystalline silicon. As another example embodiment, the active layer (ACT) may include an oxide semiconductor. The active layer (ACT) may include an impurity-doped drain region (D), a source region (S), and a channel region (C) between the drain region (D) and the source region (S).

A gate insulating layer 120 is positioned on the active layer (ACT) and the buffer layer (BF). The gate insulating layer 120 covers the active layer (ACT) on the buffer layer (BF), and may be disposed with substantially the same thickness along a profile of the active layer (ACT).

The gate insulating layer 120 may include an inorganic insulating material such as a silicon compound and/or a metal oxide.

A gate pattern may be disposed on the gate insulating layer 120. The gate pattern may include a gate electrode (GE) overlapping the active layer (ACT) and a signal wire such as a gate line.

The gate pattern may be made of a metal, an alloy, a metal nitride, a conductive metal oxide, and/or a transparent conductive material.

A first insulating layer 130 may be disposed on the gate insulating layer 120 on which the gate pattern is disposed. For example, the first insulating layer 130 may sufficiently cover the gate pattern on the gate insulating layer 120, and may have a substantially planar top side without generating a step around the gate pattern. In some embodiments, the first insulating layer 130 may cover the gate pattern on the gate insulating layer 120, and may be disposed with substantially the same thickness along the profile of the gate pattern.

The first insulating layer 130 may include a silicon compound or a metal oxide. The first insulating layer 130 may be formed to be a single layer or a plurality of layers.

A data pattern may be disposed on the first insulating layer 130. The data pattern may include a source electrode (SE) and a drain electrode (DE) of the transistor (TFT), and a signal line such as a data line.

The data pattern may be made of a metal, an alloy, a metal nitride, a conductive metal oxide, or a transparent conductive material. For example, the data pattern may be made of a metal such as copper or aluminum with high conductivity.

The data pattern may be made of a single layer or a plurality of layers. For example, the data pattern may include a titanium layer, an aluminum layer on the titanium layer, and a titanium layer on the aluminum layer.

A second insulating layer 140 may be disposed on the data pattern. The second insulating layer 140 may have a single-layer structure, but may be formed to be a multi-layered structure including at least two insulating layers. The second insulating layer 140 may be made of an organic material such as a photoresist, an acryl-based resin, a polyimide-based resin, a polyamide-based resin, and/or a siloxane-based resin.

The light-emitting device LD may be positioned on the second insulating layer 140. The light-emitting device LD may include a first electrode 181, an emission layer 182, and a second electrode 183.

The first electrode 181 may be disposed on the second insulating layer 140. According to an emission method of the display device, the first electrode 181 may be made of a reflective material or a transmittable (e.g., transparent) material. According to example embodiments, the first electrode 181 may have a single-layered or multi-layered structure including a metal film, an alloy film, a metal nitride film, a conductive metal oxide film, and/or a transparent conductive material film.

A partition wall (PDL) may be disposed on the second insulating layer 140 on which the first electrode 181 is disposed. The partition wall (PDL) may be made of an organic material or an inorganic material. For example, the partition wall (PDL) may be made of a photoresist, a polyacryl-based resin, a polyimide-based resin, an acryl-based resin, and/or a silicon compound. According to example embodiments, an opening for partially exposing the first electrode 181 by etching the partition wall (PDL) is formed. An emission region and a non-emission region of the display device may be defined by the opening of the partition wall (PDL). For example, a portion in which the opening of the partition wall (PDL) is positioned may correspond to the emission region, and the non-emission region may correspond to a portion that is near the opening of the partition wall (PDL).

The emission layer 182 may be disposed on the first electrode 181 exposed through the opening of the partition wall (PDL). The emission layer 182 may have a multi-layered structure including an emission region, a hole injection region, a hole transfer region, an electron transfer region, and an electron injection region. According to another example embodiment, except for the emission region, the hole injection region, the hole transfer region, the electron transfer region, and the electron injection region may be formed in common to overlap a plurality of pixels.

The emission region of the emission layer 182 may be formed of emission materials for generating different colors such as a red color, a green color, or a blue color depending on the respective pixels of the display device. According to other example embodiments, the emission region of the emission layer 182 may have a structure in which a plurality of emission materials for realizing different colors such as the red color, the green color, and the blue color are stacked to emit a white color. In this instance, the emission structures are formed in common to correspond to a plurality of pixels, and the respective pixels may be distinguished by the color filter layer.

The second electrode 183 may be disposed on the partition wall (PDL) and the emission layer 182. According to the emission method of the display device, the second electrode 183 may include a transmittable (e.g., transparent) material or a reflective material. According to example embodiments, the second electrode 183 may have a single-layered or multi-layered structure including a metal film, an alloy film, a metal nitride film, a conductive metal oxide film, and/or a transparent conductive material film.

The thin film encapsulation layer (TFE) may be disposed on the second electrode 183. The thin film encapsulation layer (TFE) may reduce or prevent external moisture and oxygen from permeating into the display device. The thin film encapsulation layer (TFE) may include at least one organic layer and at least one inorganic layer. The at least one organic layer and the at least one inorganic layer may be alternately stacked. For example, the thin film encapsulation layer (TFE) may include two inorganic layers and one organic layer therebetween, but the current disclosure is not limited thereto. According to another example embodiment, a sealing substrate for blocking external air or moisture from permeating into the display device may be provided instead of the thin film encapsulation layer.

When a transistor and a light-emitting device are stacked on the above-noted substrate SUB1, a threshold voltage variance of the transistor may be within 5 V. When the substrate according to an example embodiment is utilized, reliability of the circuit portion (PC) may be improved and the stable display device may be provided.

Figure 5:
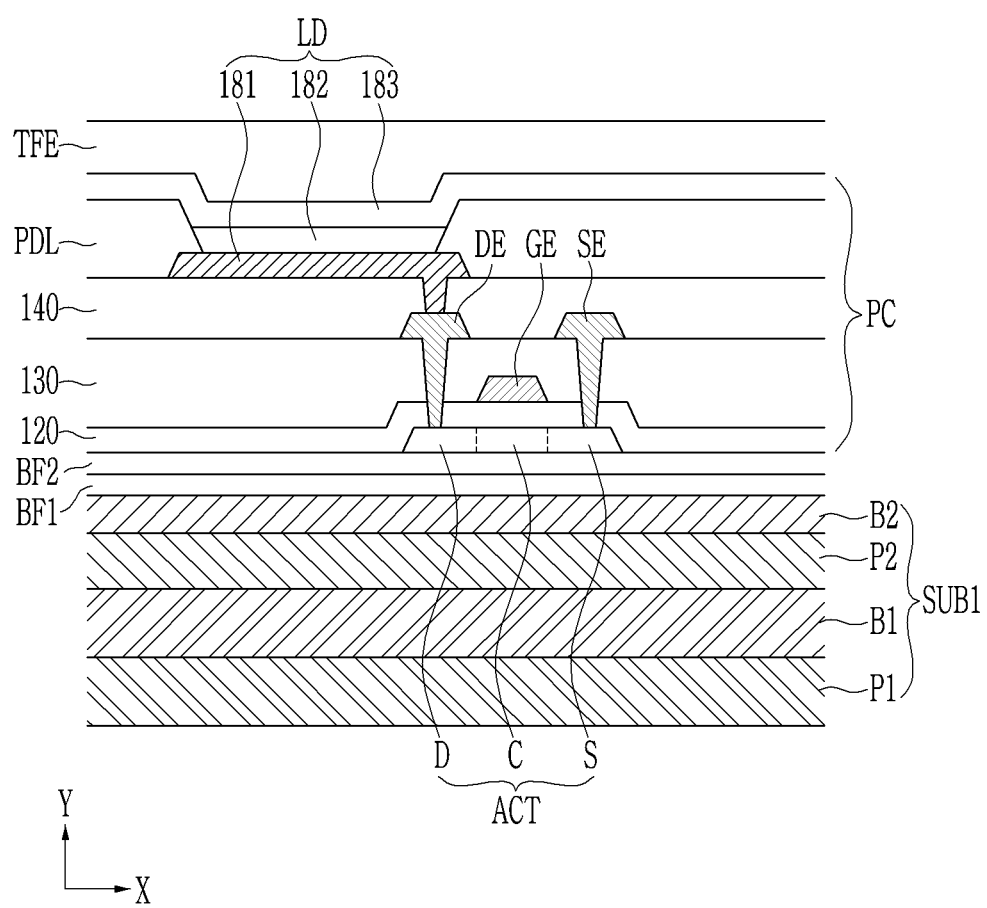
FIG. 5 shows a cross-sectional view of a display panel including a substrate according to an example embodiment.

Referring to FIG. 5, the display device may include a first buffer layer BF1 and a second buffer layer BF2. For example, the first buffer layer BF1 may be made of a silicon nitride, and the second buffer layer BF2 may be made of a silicon oxide. The second buffer layer BF2 may be thicker than the first buffer layer BF1. For example, the second buffer layer BF2 may be about 2000 angstroms to 4000 angstroms thick, and the first buffer layer BF1 may be about 300 angstroms to about 600 angstroms thick.

Figure 6:
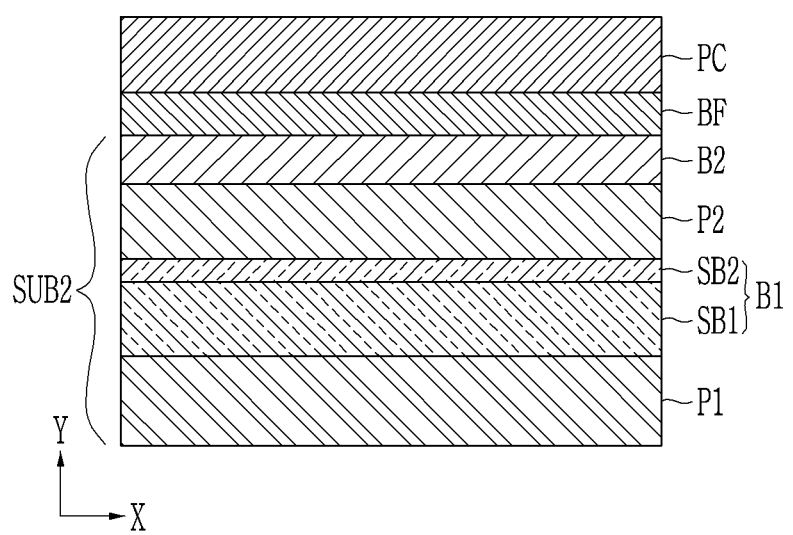
FIGS. 6-9 each show a cross-sectional view of a display panel including a substrate according to a respective example embodiment.

Referring to FIG. 6, the buffer layer (BF) and the circuit portion (PC) described with reference to FIG. 4 may be stacked on the substrate SUB2 including the first layer P1, the second layer B1 including the first sub-layer SB1 and the second sub-layer SB2, the third layer P2, and the fourth layer B2 described with reference to FIG. 3.

Figure 7:
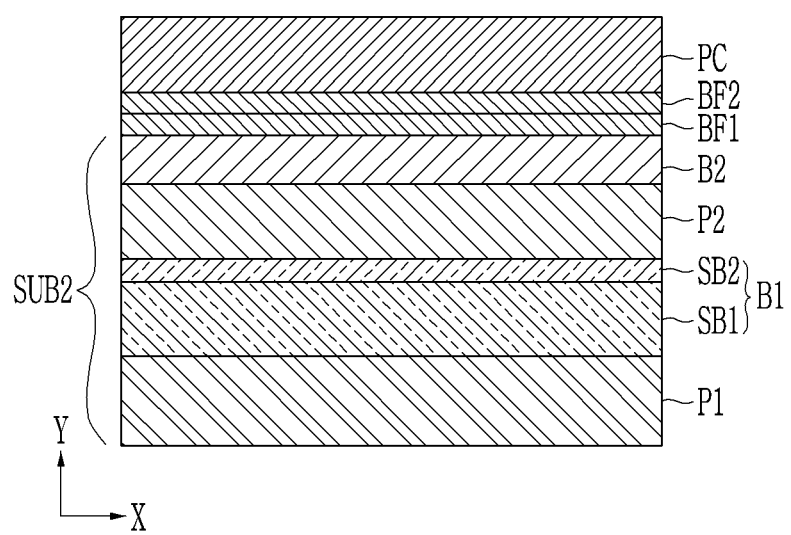

Referring to FIG. 7, the first buffer layer BF1, the second buffer layer BF2, and the circuit portion (PC) described with reference to FIG. 5 may be stacked on the substrate SUB2 including the first layer P1, the second layer B1 including the first sub-layer SB1 and the second sub-layer SB2, the third layer P2, and the fourth layer B2 described with reference to FIG. 3

Figure 8:
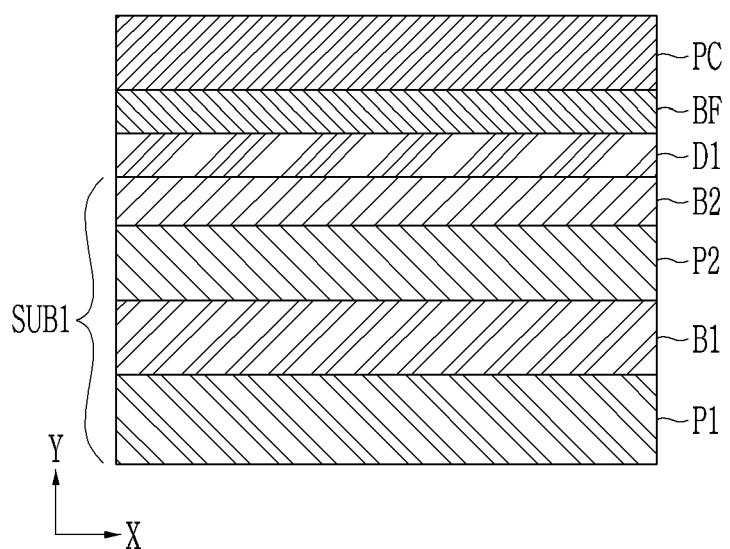

Referring to FIG. 8, the display device may further include an auxiliary layer D1 positioned between the substrate SUB1 and the buffer layer (BF) described with reference to FIG. 1. The auxiliary layer D1 may overlap a side of the substrate SUB1, or may have a set or predetermined pattern and may overlap part of the substrate SUB1.

A ground voltage or a constant voltage may be applied to the auxiliary layer D1. The auxiliary layer D1 may be a metal layer or a doped amorphous silicon (a-Si) layer. The auxiliary layer D1 may be doped with an n-type or a p-type impurity.

As the auxiliary layer D1 is positioned between the substrate SUB1 and the transistor, the charges (e.g., static charges) may be dispersed to prevent or substantially prevent elements from being damaged by static electricity.

Figure 9:
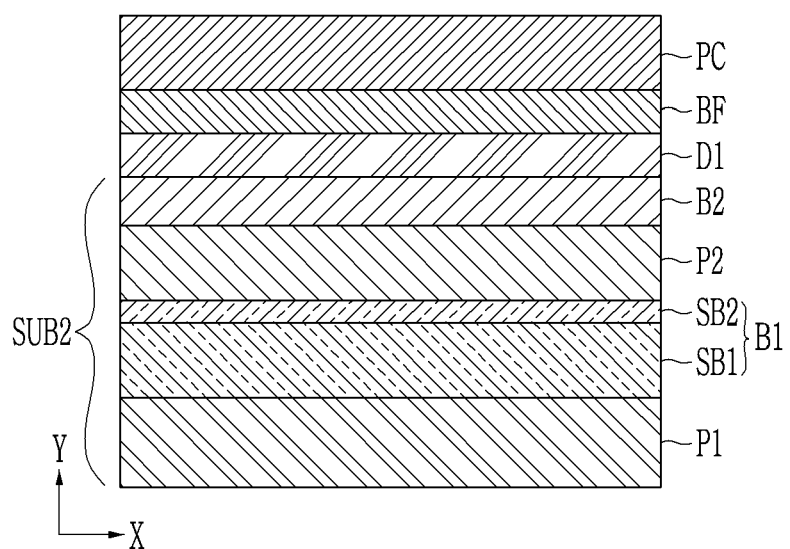

Referring to FIG. 9, the display device may further include an auxiliary layer D1 positioned between the substrate SUB2 and the buffer layer (BF) described with reference to FIG. 3. The auxiliary layer D1 may overlap a side of the substrate SUB2, or may have a set or predetermined pattern and may overlap part of the substrate SUB2.

An example embodiment (e.g., an example) and a comparative example will now be described with reference to FIGS. 10-17. FIGS. 10-17 are each a graph showing various test results of an example embodiment (e.g., an example) and a comparative example.

Referring to FIG. 10 to FIG. 15, Comparative Example 1 is a polyimide layer manufactured by utilizing 0.99 mol % of BPDA and 0.01 mol % of BPTA, Comparative Example 2 is a polyimide layer manufactured by utilizing 0.98 mol % of BPDA and 0.02 mol % of BPTA, Comparative Example 3 is a polyimide layer manufactured by utilizing 0.98 mol % of BPDA, and Example Embodiment 1 is a polyimide layer manufactured by utilizing 0.98 mol % of BPDA and 0.04 mol % of BPTA.

Figure 10:
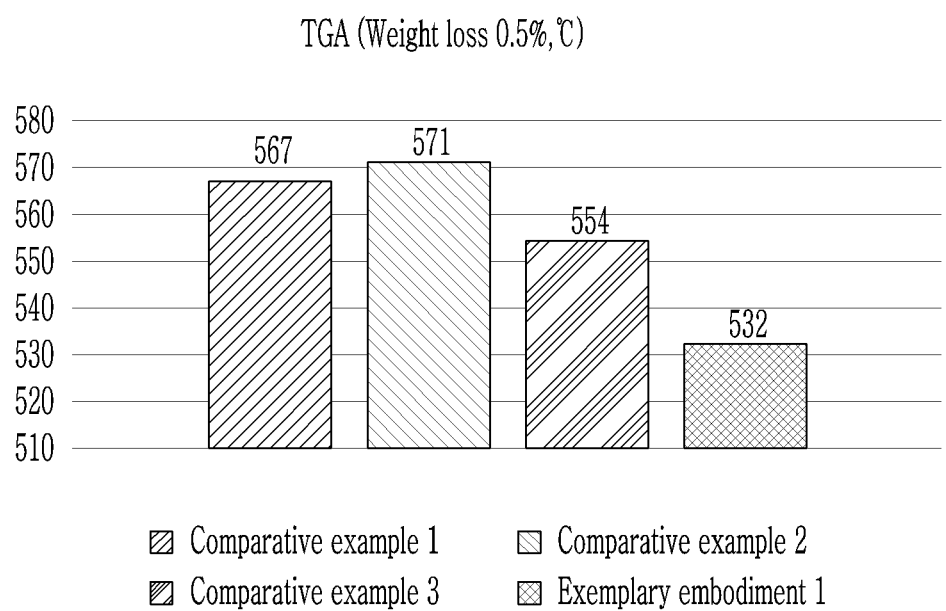
FIG. 10 is a graph showing the test results of thermal gravimetric analysis (TGA).

Referring to FIG. 10, thermal gravimetric analysis (TGA) for observing thermal stability of the polyimide layer will now be described. As shown in FIG. 10, for the temperature at which 0.5% of a mass loss is generated is observed, Comparative Example 1 shows 567 degrees (° C.), Comparative Example 2 shows 571 degrees (° C.), Comparative Example 3 shows 554 degrees (° C.), and Example Embodiment 1 shows 532 degrees (° C.). When the content of BPTA increases according to Example Embodiment 1, the thermal stability may be slightly deteriorated, but when applying to the display device, only a reference TGA value of 530 degrees (° C.) is needed, and it was found that the reference value is satisfied in the case of Example Embodiment 1.

Figure 11:
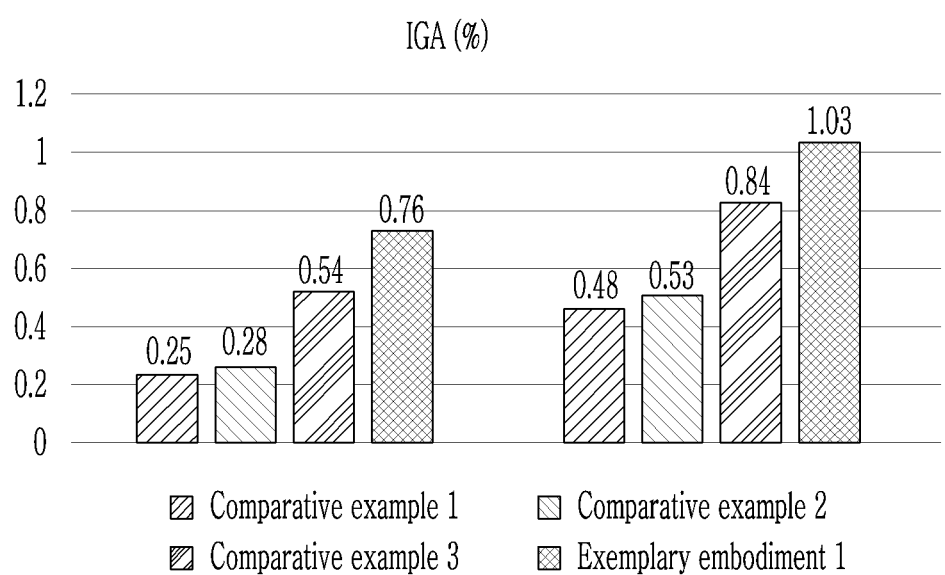
FIG. 11 is a graph showing the test results utilizing an ignitability apparatus (IGA).

Referring to FIG. 11, results of maintaining at 500 degrees (° C.) for 60 minutes (left) or maintaining at 500 degrees (° C.) for 120 minutes (right) by utilizing an ignitability apparatus (IGA) are observed. This test signifies (e.g., indicates) that the higher the value measured by the ignitability apparatus, the lower the thermal stability. When it was observed at 500 degrees (° C.) for 60 minutes, Comparative Example 1 showed 0.25%, the comparative example 2 showed 0.28%, the comparative example 3 showed 0.54%, and Example Embodiment 1 showed 0.76%. In a similar way, when it was observed at 500 degrees (° C.) for 120 minutes, Comparative Example 1 showed 0.48%, Comparative Example 2 showed 0.53%, Comparative Example 3 showed 0.84%, and the Example Embodiment 1 showed 1.03%. That is, Example Embodiment 1 showed the characteristic of relatively lower thermal stability compared to Comparative Example 1 to Comparative Example 3.

Figure 12:
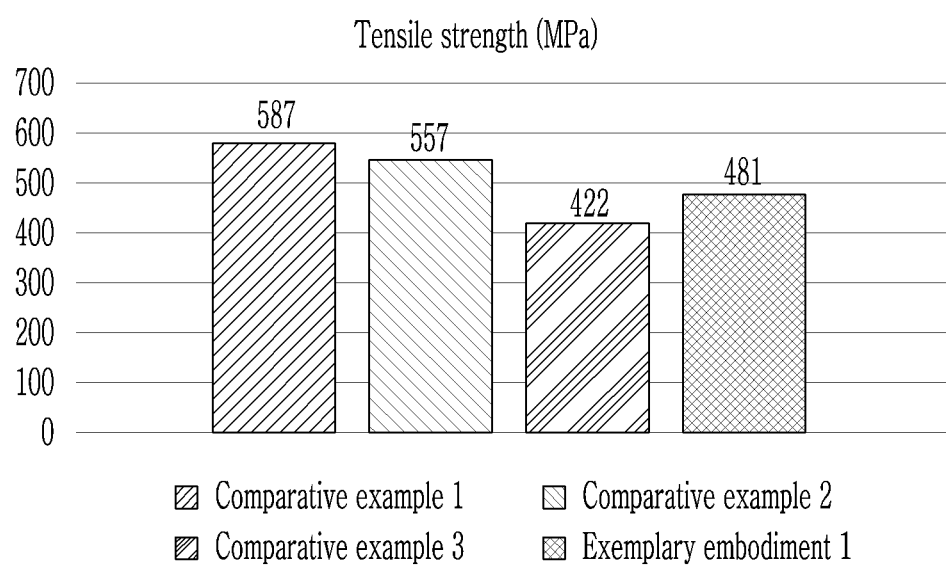
FIG. 12 is a graph showing the test results on tensile strength.

Tensile strength will be described with reference to FIG. 12. Referring to FIG. 12, Comparative Example 1 shows a tensile strength of 587 MPa, Comparative Example 2 shows a tensile strength of 557 MPa, Comparative Example 3 shows a tensile strength of 422 MPa, and Example Embodiment 1 shows a tensile strength of 481 MPa. It was found that Example Embodiment 1 may have desired (e.g., excellent) strength compared to Comparative Example 3, but may have slightly lower mechanical strength compared to Comparative Example 1 and Comparative Example 2.

Figure 13:
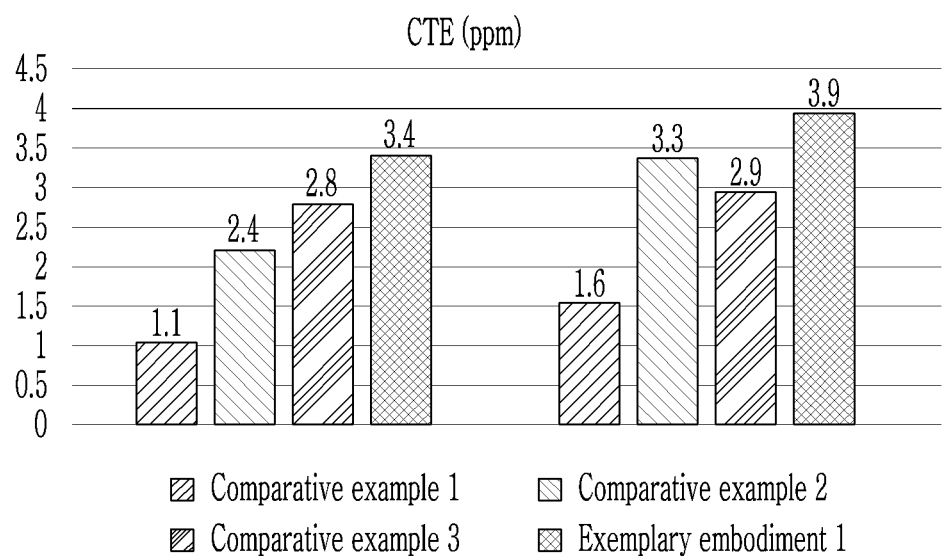
FIG. 13 is a graph showing the test results on heat expansion coefficient (CTE).

A heat expansion coefficient (CTE) will now be described with reference to FIG. 13. It was found that Comparative Example 1 has a CTE of 1.1 ppm/° C. at 50 degrees (° C.) to 200 degrees (° C.), Comparative Example 2 has a CTE of 2.4 ppm/° C., Comparative Example 3 has a CTE of 2.8 ppm/° C., and Example Embodiment 1 has a CTE of 3.4 ppm/° C. Further, in the range of 50 degrees (° C.) to 300 degrees (° C.), Comparative Example 1 shows a CTE of 1.6 ppm/° C., Comparative Example 2 shows a CTE of 3.3 ppm/° C., Comparative Example 3 shows a CTE of 2.9 ppm/° C., and Example Embodiment 1 shows a CTE of 3.9 ppm/° C. This signifies (e.g., indicates) that when the heat expansion coefficient is higher, the mechanical characteristic is slightly lower, and it was found in the case of Example Embodiment 1 that the mechanical characteristic may be relatively (e.g., somewhat) deteriorated compared to Comparative Example 1 and Comparative Example 2.

Figure 14:
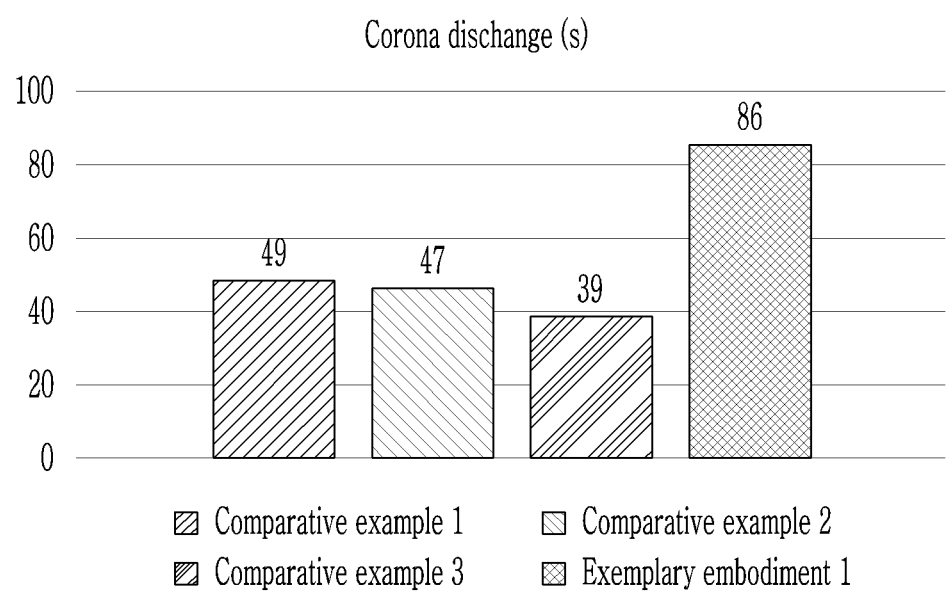
FIG. 14 is a graph showing the half-life values obtained by utilizing the corona discharging method.

A half-life value obtained by utilizing the corona discharging method will now be described with reference to FIG. 14. Comparative Example 1 shows a half-life of 49 seconds (s), Comparative Example 2 shows a half-life of 47 seconds (s), Comparative Example 3 shows a half-life of 39 seconds (s), and Example Embodiment 1 shows a half-life of 86 seconds (s). It was found that Example Embodiment 1 has a half-life that is twice or more longer than Comparative Example 1 to Comparative Example 3. This signifies (e.g., indicates) that Example Embodiment 1 has a higher resistance than each of Comparative Example 1 to Comparative Example 3, and it was therefore found that Example Embodiment 1 has desired (e.g., excellent) electrical characteristic compared to each of Comparative Example 1 to Comparative Example 3. The substrate including the polyimide layer according to Example Embodiment 1 has relatively higher resistance, thereby improving the afterimages or light stains observed in the display device.

Figure 15:
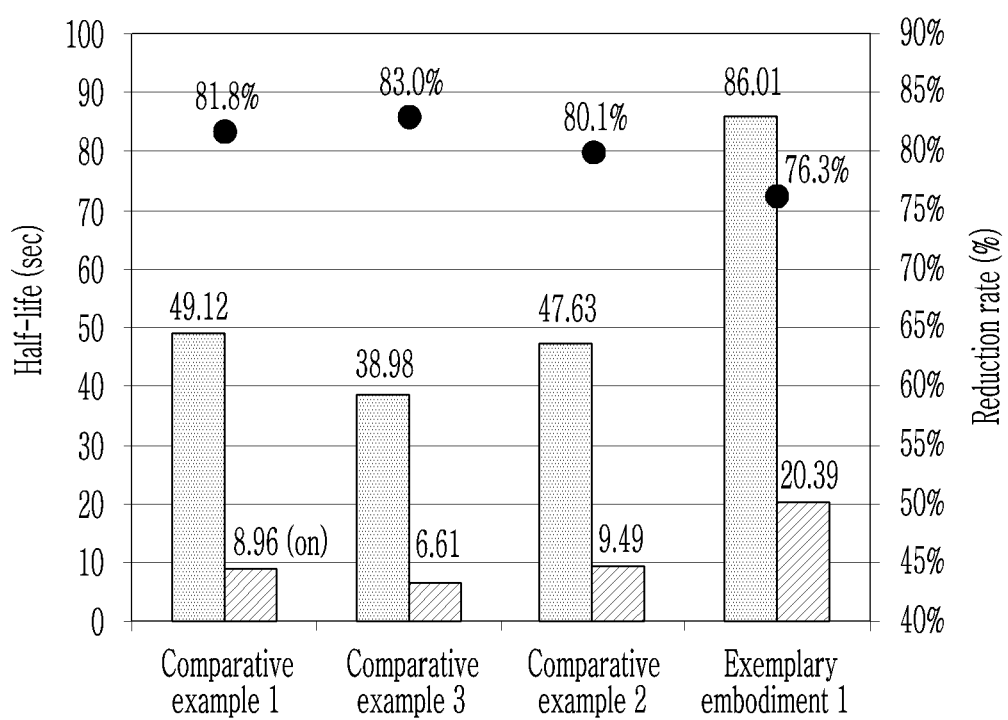
FIG. 15 is a graph showing the half-life reduction rate when performing the corona discharge method and when additional irradiating of light was performed.

Next, with reference to FIG. 15, the half-life reduction rate when performing the corona discharge method for Comparative Examples 1 to 3 and Example 1 with additional irradiating of light will be described. In respective graphs, the left side represents the half-life when the corona discharging method is performed without additional light irradiation, and the right side represents the half-life changed by additional light irradiation. It was found that Comparative Example 1 has a reduction of the half-life of about 81.8%, Comparative Example 2 has a reduction of half-life of about 80.1%, Comparative Example 3 has a reduction of half-life of about 83.0%, and Example Embodiment 1 has a reduction of half-life of about 76.3%. According to this result, the electrical characteristic of the substrate may be changed (e.g., when irradiated with light), and it was found that Example Embodiment 1 including a specific content of BPTA has a relatively lower changing degree of the electrical characteristic. That is, it was found that Example Embodiment 1 has better (e.g., excellent) electrical stability to light compared to Comparative Example 1 to Comparative Example 3.

Figure 16:
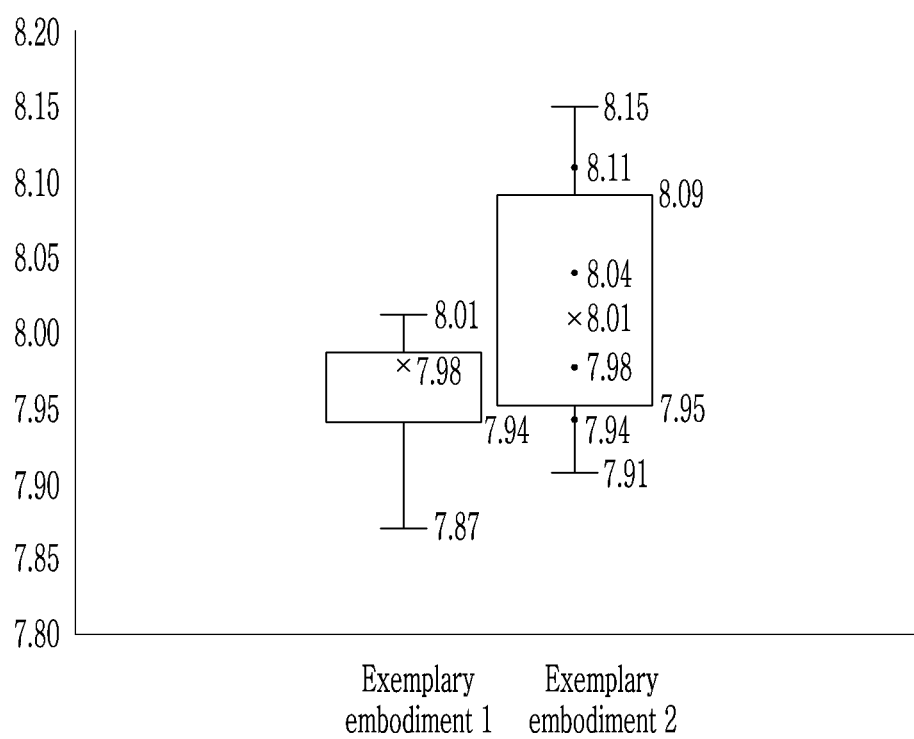
FIG. 16 is a graph showing the test results of small-angle X-ray scattering (SAXS) analysis.

FIG. 16 shows results of small-angle X-ray scattering (SAXS) analysis of Example Embodiment 1 (a polyimide layer that is 5.8 micrometers thick) and Example Embodiment 2 (a polyimide layer that is 10 micrometers thick).

For Example Embodiment 1, it was found that the value q of the scattering vector is about 7.87 to about 8.01 with reference to the side (004) in a plane mode. Further, it was found for Example Embodiment 2 that the value q is about 7.91 to 8.15. It was found that the value q may be slightly changed according to the thickness, but when it is manufactured by utilizing the same dianhydride monomer and diamine monomer, the value q satisfies a specific range (7.87 to 8.15). When an organic layer having another range is needed, it may be manufactured by utilizing the monomer that is different from BPDA and PPD according to an example embodiment.

Figure 17:
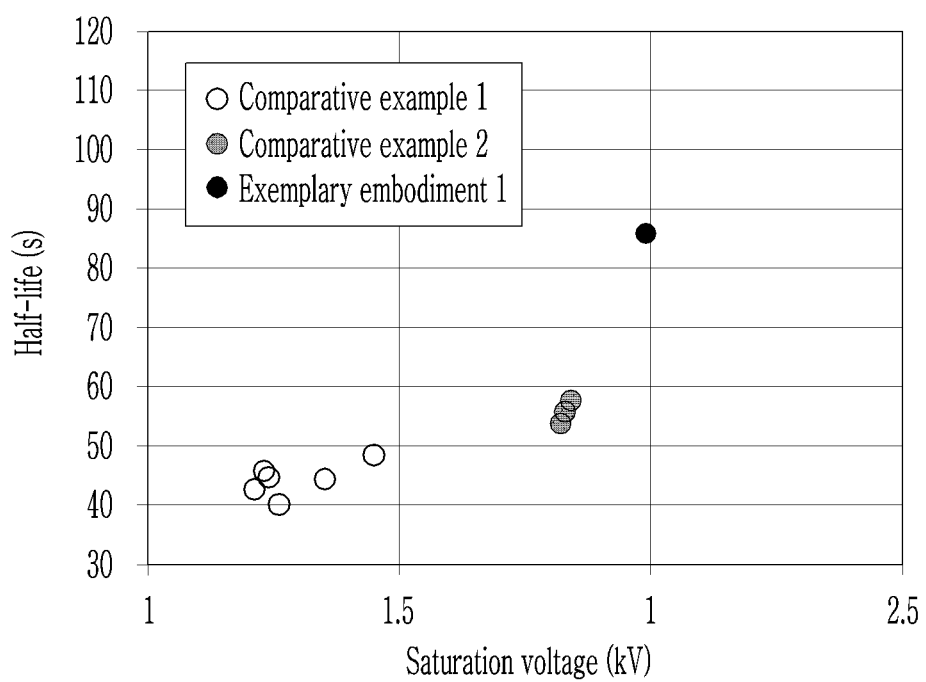
FIG. 17 is a graph showing the half-life values obtained by utilizing the corona discharging method.

Referring to FIG. 17, Comparative Example 1 represents a polyimide layer with a thickness of 5.8 micrometers manufactured by including 0.01 mol % of BPTA, Comparative Example 2 represents a polyimide layer with a thickness of 10 micrometers manufactured by including 0.01 mol % of BPTA, and Example Embodiment 1 represents a polyimide layer with a thickness of 10 micrometers manufactured by including 0.04 mol % of BPTA.

It was found that Example Embodiment 1 has a half-life value of about 86 seconds when tested utilizing the corona discharging method, and has a half-life difference of equal to or greater than at least 30 seconds (s) in comparison to Comparative Example 1 and Comparative Example 2.

Expressions such as "at least one of", "one of", "at least one selected from", "one selected from", "at least one selected from among", or "one selected from among" when preceding a list of elements, modify the entire list of elements and do not modify the individual elements of the list. Further, the use of "may" when describing embodiments of the present invention refers to "one or more embodiments of the present invention."

It will be understood that when an element or layer is referred to as being "connected to", "coupled to", or "adjacent to" another element or layer, it can be directly connected to, coupled to, or adjacent to the other element or layer, or one or more intervening elements or layers may be present. In contrast, when an element or layer is referred to as being "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art.

Moreover, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

While this disclosure has been described in connection with what is presently considered to be practical example embodiments, it is to be understood that the disclosure is not limited to the disclosed embodiments, but, on the contrary, is intended to cover various suitable modifications and equivalent arrangements included within the spirit and scope of the appended claims, and equivalents thereof.

DESCRIPTION OF SYMBOLS

| SUB1: substrate | SUB2: substrate |
|---|---|
| P1: first layer | B1: second layer |
| P2: third layer | B2: fourth layer |
| BF: buffer layer | ACT: active layer |
| S: source region | C: channel region |
| D: drain region | 120: gate insulating layer |
| GE: gate electrode | 130: first insulating layer |
| SE: source electrode | DE: drain electrode |
| 140: second insulating layer | 181: first electrode |
| 182: emission layer | 183: second electrode |
| LD: light-emitting device | TFE: thin film encapsulation layer |

What is claimed is:

1. A display device comprising:
a substrate;
a transistor on the substrate; and
a light-emitting device electrically connected to the transistor,
wherein the substrate comprises:
a first layer,
a second layer between the first layer and the transistor, and
a third layer between the second layer and the transistor,
the first layer comprises a first organic material and the third layer comprises a second organic material,
the first organic material and the second organic material have different half-lives for a corona discharge,
the first layer and the third layer are each manufactured utilizing an aromatic carboxylic acid and a polyamic acid generated by polymerizing a dianhydride monomer and a diamine monomer, and
a first content of the aromatic carboxylic acid for forming the first layer is different from a second content of the aromatic carboxylic acid for forming the third layer.

2. The display device of claim 1, wherein
the second content is greater than the first content.

3. The display device of claim 1, wherein
the first layer is less in half-life than the third layer.

4. The display device of claim 3, wherein
the third layer has equal to or greater than 60 seconds in half-life.

5. The display device of claim 1, wherein
the first layer and the third layer have substantially a same scattering vector (q) value in a small-angle X-ray scattering (SAXS).

6. The display device of claim 1, wherein
the first layer and the third layer are different in transmittance at a specific wavelength.

7. The display device of claim 6, wherein
the third layer at the specific wavelength is higher in transmittance than the first layer.

8. The display device of claim 6, wherein
the third layer is equal to or greater than 80% in transmittance at a wavelength of 450 nm.

9. A display device comprising:
a substrate;
a transistor on the substrate; and
a light-emitting device electrically connected to the transistor,
wherein the substrate comprises
a first layer,
a second layer between the first layer and the transistor, and
a third layer between the second layer and the transistor,
the first layer and the third layer comprise organic materials, and
the first layer and the third layer have different scattering vector (q) values in small-angle X-ray scattering (SAXS).

10. The display device of claim 9, wherein
one selected among the first layer and the third layer has a scattering vector value in a range of about 7.87 to about 8.15, and the other one thereof has a scattering vector value outside the range.

11. The display device of claim 9, wherein
the first layer and the third layer are different in half-life for a corona discharge.

12. The display device of claim 11, wherein
the first layer is less in half-life than the third layer.

13. The display device of claim 11, wherein
the third layer is equal to or greater than 60 seconds in half-life.

14. A display device comprising:
a substrate;
a transistor on the substrate; and
a light-emitting device electrically connected to the transistor,
wherein the substrate comprises
a first layer,
a second layer between the first layer and the transistor, and
a third layer between the second layer and the transistor, and
the first layer and the third layer comprise organic materials, and
the first layer and the third layer are different in transmittance at a specific wavelength.

15. The display device of claim 14, wherein
the third layer is higher in transmittance than the first layer.

16. The display device of claim 15, wherein
the third layer is equal to or greater than 80% in transmittance at a wavelength of 450 nm.

17. The display device of claim 14, wherein
the first layer and the third layer have different scattering vector (q) values in small-angle X-ray scattering (SAXS).

18. The display device of claim 17, wherein
one selected from among the first layer and the third layer has a scattering vector value in a range of about 7.87 to about 8.15, and the other one thereof has a scattering vector value outside the range.

* * * * *